United States Patent [19]

Tsai et al.

[11] Patent Number: 5,032,202
[45] Date of Patent: Jul. 16, 1991

[54] PLASMA GENERATING APPARATUS FOR LARGE AREA PLASMA PROCESSING

[75] Inventors: Chin-Chi Tsai; Steven M. Gorbatkin; Lee A. Berry, all of Oak Ridge, Tenn.

[73] Assignee: Martin Marietta Energy Systems, Inc., Oak Ridge, Tenn.

[21] Appl. No.: 416,804

[22] Filed: Oct. 3, 1989

[51] Int. Cl.⁵ .................. H01L 21/306; C23C 14/00
[52] U.S. Cl. .................. 156/345; 156/643; 118/723; 219/121.43; 315/111.71; 315/111.41; 204/298.37; 204/298.38
[58] Field of Search ............... 156/345, 643; 219/399, 219/121.36, 121.43; 204/298.38, 298.37; 315/111.21, 111.41, 111.71, 111.81; 118/722, 723

[56] References Cited

U.S. PATENT DOCUMENTS

| | | | |
|---|---|---|---|
| 4,483,737 | 11/1984 | Mantei | 156/345 |
| 4,713,585 | 12/1987 | Ohno et al. | 315/111.81 |
| 4,727,293 | 2/1988 | Asmussen et al. | 315/111.41 |
| 4,745,337 | 5/1988 | Pichot et al. | 156/345 |
| 4,778,561 | 10/1988 | Ghanbari | 156/345 |
| 4,877,509 | 10/1989 | Ogawa et al. | 156/345 |

FOREIGN PATENT DOCUMENTS

| | | | |
|---|---|---|---|
| 0089382 | 9/1983 | European Pat. Off. | 156/345 |
| 0094725 | 5/1985 | Japan | |
| 0150219 | 7/1986 | Japan | 156/345 |
| 0172334 | 8/1986 | Japan | 156/345 |
| 0207131 | 8/1988 | Japan | 156/345 |

Primary Examiner—Richard V. Fisher
Assistant Examiner—Todd J. Burns
Attorney, Agent, or Firm—James M. Spicer; Ivan L. Ericson

[57] ABSTRACT

A plasma generating apparatus for plasma processing applications is based on a permanent magnet line-cusp plasma confinement chamber coupled to a compact single-coil microwave waveguide launcher. The device creates an electron cyclotron resonance (ECR) plasma in the launcher and a second ECR plasma is created in the line cusps due to a 0.0875 tesla magnetic field in that region. Additional special magnetic field configuring reduces the magnetic field at the substrate to below 0.001 tesla. The resulting plasma source is capable of producing large-area (20-cm diam), highly uniform (±5%) ion beams with current densities above 5 mA/cm². The source has been used to etch photoresist on 5-inch diam silicon wafers with good uniformity.

13 Claims, 3 Drawing Sheets

PLASMA GENERATING APPARATUS FOR LARGE AREA PLASMA PROCESSING

The U.S. Government has rights in this invention pursuant to Contract No. DE-AC05-840R21400 awarded by U.S. Department of Energy contract with Martin Marietta Energy Systems, Inc.

TECHNICAL FIELD

This invention relates generally to plasma ion sources, and more particularly to a plasma source utilizing a microwave waveguide launcher together with a line cusp magnetic multipole in new relationship that produces a particularly uniform and dense plasma over a large area.

BACKGROUND ART

High power microwaves can break down a gas to produce electrons and ions, and the ionization process is enhanced by also applying a magnetic field. This is the basis for microwave electron cyclotron resonance (ECR) ion sources. —David B. Miller and George W. Bethke, "Cyclotron Resonance Thruster Design Techniques," AIAA J, 4(5), 835–840 (1966). In semiconductor manufacture, microwave ECR ion sources have been applied to the plasma etching and ion implanting of substrates. In such sources, an etching gas is fed into a microwave waveguide plasma production region which is itself within the magnetic field region. Microwave power is introduced into the waveguide resulting in an ECR discharge from which the etching or implanting ion beam is obtained. —Keizo Suzuki, et al, "Microwave Plasma Etching," Jap. J. of App. Physics, 16(11), 1979–1984 (1977). —Seitaro Matsuo and Yoshio Adachi, "Reactive Ion Beam Etching Using a Broad Beam ECR Ion Source," Jap. J. of App. Physics, 21(1), L4–L6 (1982). —Noriyuki Sakudo, et al, "High-Current Ion Implanter Using a Microwave Ion Source," Rev. Sci. Instrum. 54(6), 681–684 (1983).

In the field of plasma physics, a particular type of plasma confinement known as the magnetic multipole is known for its ability to produce a quiescent and uniform large-area plasma. —Rudolf Limpaecher and K. R. MacKenzie, "Magnetic Multipole Containment of Large Uniform Collisionless Quiescent Plasmas," Rev. Sci. Instrum. 44(6), 726–731 (1973). A line cusp magnetic multipole configuration was used in the 1970's to improve the plasma density and uniformity of the Oak Ridge National Laboratory duoPIGatron ion source. —C. C. Tsai et al, "DuoPIGatron Ion Source for PLT Injectors," Proc. of the 7th Symp. on Eng. Problems of Fusion Research, IEEE Pub. No. 77CH1267-4-NPS, 278–283 (1977). —W. L. Stirling, C. C. Tsai, and P. M. Ryan, "15 cm duoPIGatron Ion Source," Rev. Sci. Instrum. 48(5), 533–536 (1977).

In 1984, a filament-emission line cusp magnetic multipole device was applied to plasma etching. —Thomas D. Mantei, U.S. Pat. No. 4,483,737 (Nov. 20, 1984). Also in 1984, microwave ECR sources began to be combined with magnetic multipoles, with the possibility of applying the technology to large scale plasma etching being immediately recognized. —L. Pomathiod, et al, "Microwave Excitation of Large Volumes of Plasma at Electron Cyclotron Resonance in Multipolar Confinement," Physics Letters, 106A(7), 301–304 (1984). —Y. Arnal, et al, "Plasma Etching in Magnetic Multipole Microwave Discharge," Appl. Phys. Lett 45(2), 132–134 (1984).

In 1988, a distributed ECR source appeared which injected the microwave energy into the line cusps of a magnetic multipole by means of multiple tubular applicators. —Rudolf R. Burke and Claude Pomot, "Microwave Multipolar Plasma for Etching and Deposition," Solid State Technology, 67–71 (Feb. 1988). —Michel Pichot, Jacques Pelletier, and Yues Arnal, U.S. Pat. No. 4,745,337 (May 17, 1988). —RCE 160: The Microwave DECR Reactor, Product Bulletin, ALCATEL DVM, France (May 1988). Again in 1988, there appeared a plasma generating apparatus which utilized permanent magnets in the microwave launcher; Yoshimi Hakamata, "Plasma Generating Apparatus", European Patent Application No. 0 286 132 (Filed Apr. 8, 1988).

A recent paper describes apparatus which combines an ECR source chamber with a multipole magnet structure. —Thomas D. Mantei, "High Density Plasmas for Semiconductor Processing," Proc. 7th Symp. on Plasma Processing, 173rd Mtg. of the Electrochemical Society, Atlanta (1988).

In addition to this prior art, various other plasma generating devices are known. Some of these are: —Jes Asmussen, "Electron Cyclotron Resonance Microwave Discharges for Etching and Thin Film Deposition," to be published as Chapter 11 of *Plasma-Based Processing*, edited by S. M. Rossnagel, J. J. Cuomo and W. D. Westwood, Noyes Pub. N.J. in 1989. —Davod J. Drage and Toufic Safi, U.S. Pat. No. 4,857,138 (Aug. 15, 1989). —Akihisa Yoshida, et al, U.S. Pat. No. 4,859,908 (Aug. 22, 1989).

DISCLOSURE OF THE INVENTION

In accordance with the present invention, there is provided a plasma generating apparatus comprising a vacuum vessel and a means for introducing a plasma processing gas into the vacuum vessel. A source feeds microwaves into a microwave waveguide launcher attached to the vacuum vessel. The microwave waveguide launcher includes a launcher waveguide that is within an axial magnetic field. A launcher ECR plasma is produced from the processing gas in the launcher waveguide by microwaves present in the launcher waveguide. A cylindrical multipole magnetic field that is coaxial with the microwave waveguide launcher is located in the vacuum vessel. The multipole magnetic field is adapted for producing an electron cyclotron resonance and confining plasma. A line cusp ECR plasma is produced from the processing gas in the multipole magnetic field from microwaves propagating in the vacuum vessel. The launcher ECR plasma and line cusp ECR plasma produce a main plasma in the multipole magnetic field.

BEST MODE FOR CARRYING OUT THE INVENTION

Figure 1:
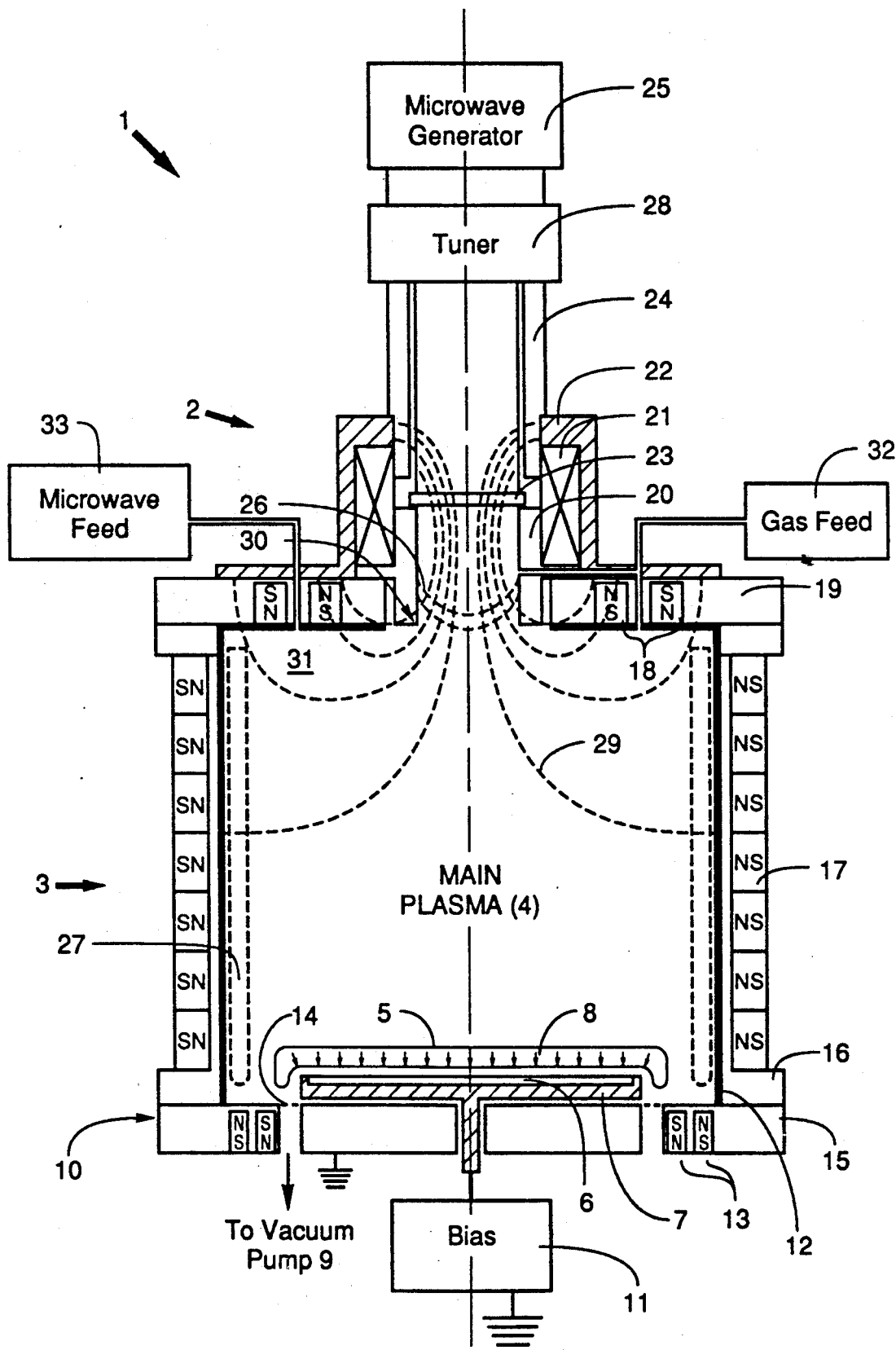
FIG. 1 is a schematic diagram showing in axial cross-sectional view the plasma generating apparatus for large area plasma processing of the present invention.

Referring to FIG. 1, a plasma generating apparatus 1 is adapted to generate and contain plasmas for large area plasma processing. It comprises a nonmagnetic cylindrical vacuum vessel 10, or vacuum vessel 10 with vacuum liner 12. The vacuum vessel 10, or liner 12 if used, must be compatible with the plasmas and reactants inside the vessel. Within the vacuum vessel 10 is a main plasma 4 created by microwave energy applied to a microwave waveguide launcher 2. The main plasma 4 is confined by a cylindrical multipole magnetic field 3. The multipole magnetic field 3 is generated by line cusp permanent magnet columns 17 with alternating polarity, lower ring magnets 13, upper ring magnets 18, and solenoid magnet 21. The permanent magnets should be of a material such as samarium cobalt, for example, which can produce a strong magnetic field with light weight and compact size. The ring magnets 13, 18 can be built up from individual bar magnets or may be supplied from a commercial source. Not all of the magnetic field lines are shown in FIG. 1 for simplicity. The magnetic field lines of the solenoid magnet 21 are shown, but not shown are the magnetic field lines of all the permanent magnets. The permanent magnet columns 17 are installed azimuthally and evenly on the outside walls of the cylindrical chamber 16. Alternately, the magnet columns 17 may be located inside the chamber 16 if required by a particular application. The solenoid magnet 21 and cylindrical chamber 16 share a common central axis.

Figure 2:
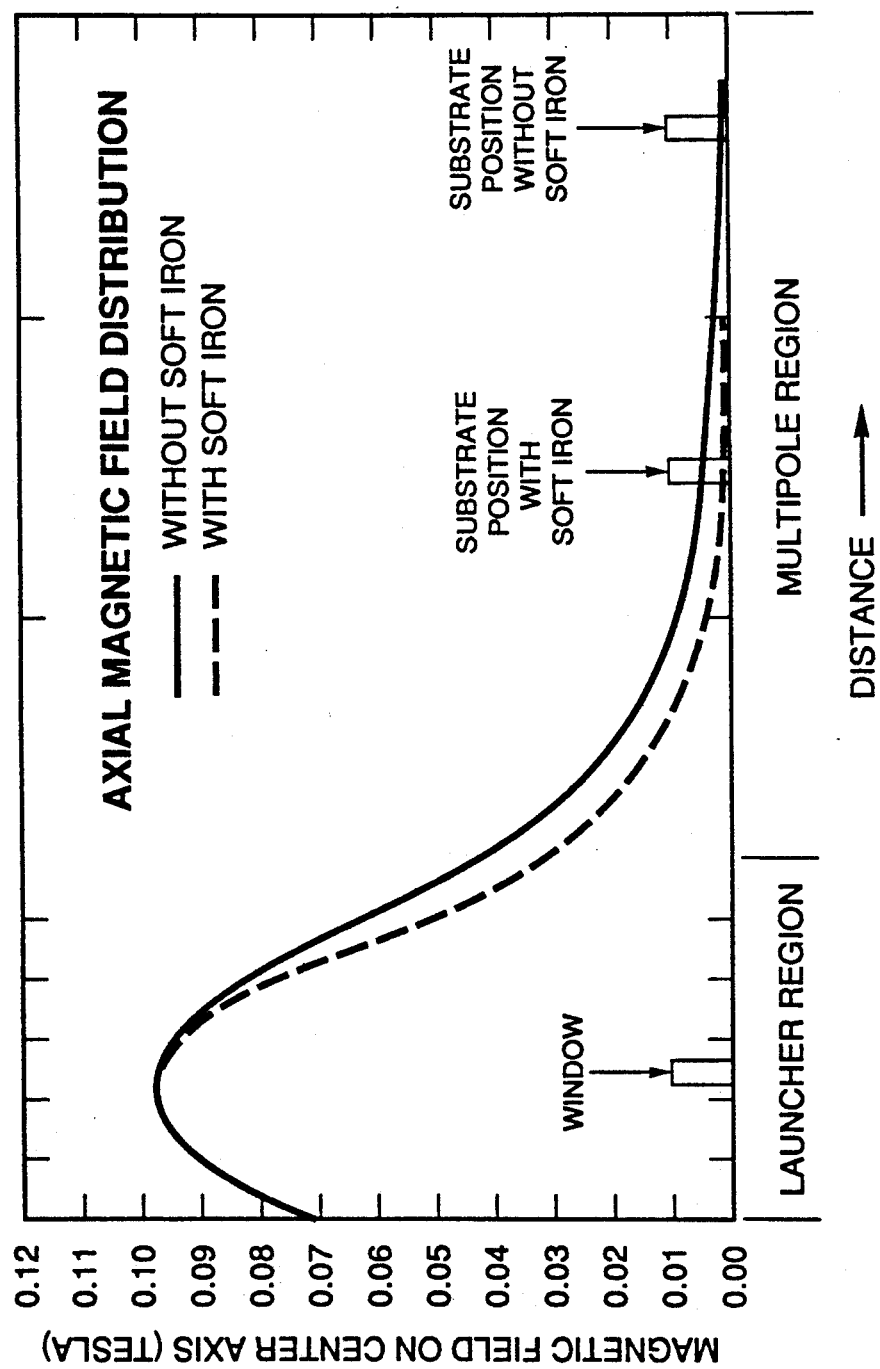
FIG. 2 shows the distribution of axial magnetic field with and without the soft iron magnetic flux return surrounding the solenoid magnet.

The vacuum vessel 10 consists of the cylindrical chamber 16, bottom plate 15, and top plate 19. The bottom (or base) plate 15 supports the plasma generating apparatus 1, a metal substrate holder 7, microwave screen 14, and links (not shown) to the vacuum pump 9. The top plate 19 has grooves for receiving the upper ring magnets 18 with the innermost (or smallest) ring magnet having polarity opposite to that of the solenoid magnet 21 which surrounds the launcher waveguide 20. The lower ring magnets 13 are mounted in grooves in the bottom plate 15 with the innermost (or smallest) ring magnet having polarity identical to that of the innermost ring magnet in the top plate. Surrounding the solenoid magnet 21 and launcher waveguide 20 is a cylindrically-shaped soft iron magnetic flux return 22. In addition to a cylindrical body portion, the magnetic flux return 22 additionally comprises a ring-shaped end portion inwardly extending over the top of magnet 21 and a ring-shaped end portion outwardly extending over and fastened on the top plate 19. As FIG. 2 shows, the magnetic field along the central axis decreases more rapidly for the case with the soft iron than for the case without the soft iron.

Vacuum seals are provided for the launcher waveguide 20 at the microwave window 23 adjacent the rectangular waveguide 24. A gas feed system 32 supplies the necessary gas for plasma processing by feeding into gas distributing ducts in the walls of the launcher waveguide 20 and top plate 19. The gas is ionized by hot (or energetic) electrons produced inside the launcher electron cyclotron resonance (ECR) plasma 26 and line-cusp ECR plasma 27. With 2.45 GHz microwave energy being applied, these ECR plasmas 26 and 27 are created in regions having 0.0875 tesla magnetic field. That is, an axial magnetic field of about 0.0875 tesla due to the solenoid magnet 21 is sufficient to produce an electron cyclotron resonance with 2.45 GHz microwaves in the microwave waveguide launcher region. Likewise, the multipole magnetic field of about 0.0875 tesla generated by elements 17, 13, 18, 21, previously described, also produces an electron cyclotron resonance with the 2.45 GHz microwaves in the line cusp ECR plasma region. Other frequencies with proportionate magnetic fields can be used.

The combination of the launcher ECR plasma 26 and the line cusp ECR plasma 27 produces sufficient hot electrons to create a dense plasma 4 in the main plasma chamber 31. Plasma ions in the main plasma 4 have relatively random motion, and thus the main plasma is an axisymmetric diffusion plasma.

The plasma ions 8 will diffuse down from the main plasma 4 to the substrate 6 on the substrate holder 7. The metal substrate holder 7 may be biased by the electrical biasing supply 11 to control the energy of the plasma ions 8 hitting the substrate. The electrical supply 11 can be DC or RF depending upon the substrate material and its processing. The main plasma ions 8 have highly directional perpendicular incidence on the substrate because of the extremely low magnetic field at the substrate.

The operating conditions are optimized either by gas pressure, microwave power input, or applying a magnetic field at the solenoid magnet 21 to get a uniform main plasma 4 over the substrate with sufficient density.

The microwave energy for the plasma generation is supplied by the microwave generator 25 and transported through the microwave tuner 28 (including circulator and directional coupler) and into the rectangular waveguide 24. The tuner 28 is used to adjust or optimize the microwave transmission into the microwave waveguide launcher 2. The microwaves in the waveguide 24 enter the launcher waveguide 20 after passing through the microwave window 23.

Inside the launcher waveguide 20, the microwave energy propagates in a direction parallel to the central axis, and consists of two components, namely right hand circularly polarized (RHCP) and left hand circularly polarized (LHCP) microwaves. If the launcher ECR plasma 26 density is above the LHCP cutoff of about $7 \times 10^{10}$ per $cm^3$ for 2.45 GHz microwaves, then the LHCP microwaves are reflected back toward the microwave generator 25 by the launcher ECR plasma 26. Such an operating mode is called the overdense mode. If the launcher ECR plasma density is below the LHCP cutoff, the operating mode is called the underdense mode.

Figure 3:
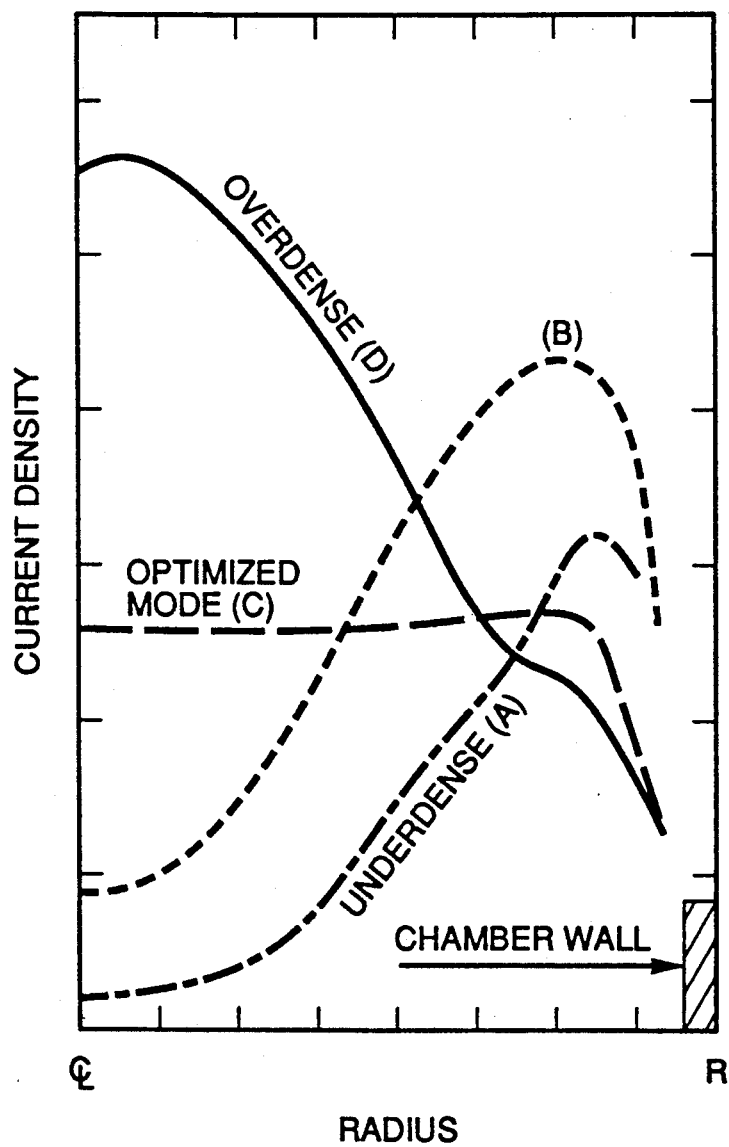
FIG. 3 shows spatial plasma profiles at the substrate being produced under different operating modes of the plasma apparatus of FIG. 1.

As FIG. 2 also illustrates, the magnetic field falls off to below 0.001 tesla in the near-magnetic field-free region 5 immediately above the substrate 6. With reference to FIG. 3, the overdense and underdense modes can be employed to produce plasmas in the near-magnetic field-free region 5 with the peak (case D) and hollow (cases A, B) profiles, respectively. A plasma with a flat density profile can be created by optimizing the gas pressure or throughput, solenoid magnetic field, microwave input power, etc. in both the underdense and overdense modes. Such a plasma profile is desirable for large area plasma processing. Thus, this operating mode is called the optimized mode and corresponds to case C in FIG. 3. It will be appreciated that in the optimized mode, this invention makes possible a plasma density that is variable to over $1 \times 10^{11}$ per $cm^3$ with a temperature up to 5 eV over a large area that extends to about 3 cm from the cylindrical chamber 16 wall. FIG.

3, case C, illustrates the very close approach of the uniform plasma region to the chamber wall as desired.

At low pressures and low microwave powers, the plasma density in the launcher waveguide 20 is below the LHCP cutoff. Under such conditions corresponding to underdense modes, the LHCP microwaves are not absorbed in the launcher ECR plasma 26 but are transmitted through it and absorbed in the line cusp ECR plasma 27, increasing the plasma density there. The RHCP microwaves are absorbed efficiently to produce hot electrons in the launcher ECR plasma 26. These hot electrons move along the magnetic field lines 29. Some of the hot electrons are lost to the output end 30 of the launcher waveguide 20 and the top plate 19 as the hot electrons following the magnetic field lines intersect the output end 30 and top plate 19. These effects produce the hollow profiles shown in FIG. 3, cases A, B. As the gas pressure is increased, plasma generation by the RHCP microwaves in the launcher ECR plasma 26 increases proportionally, and the profiles fill in and become peaked. At the resulting higher plasma density (most likely above cutoff), the LHCP microwaves are reflected back into the microwave generator 25, and the plasma production in the cusp field region is substantially reduced. The gas pressure and solenoid magnetic field can be used to adjust and control the plasma production in the launcher ECR plasma 26 and in the line cusp ECR plasma 27. Consequently, a flat plasma profile can be obtained in the optimized mode (FIG. 3, case C).

During the initial development phases, the source was operated with argon, oxygen, helium, and hydrogen plasmas. An oxygen plasma was used to perform uniform and anisotropic etching on photoresist films of 12.7 cm silicon wafers. An etching rate of 0.15 micrometers per minute was observed.

In a preferred embodiment, if the launcher waveguide 20 has a rectangular output end 30, then a fraction of the magnetic field lines which should move into the cylindrical multipole magnetic field 3 are blocked by the (rectangular) output end 30. In order to allow those field lines to move into the multipole magnetic field 3, the output end 30 can be made as a conical output end, i.e., the launcher waveguide 20 tapering from a rectangular cross-section to a circular cross-section at the output end. The launcher waveguide 20 is thus understood to have two embodiments. It may be rectangular throughout its entire length in the manner of rectangular waveguide 24, or in a preferred embodiment that allows more hot electrons moving along magnetic field lines to escape out the output end 30, is rectangular at its input end (window 23 end) and opens up to a conical shape at the output end 30. In this latter embodiment, the launcher waveguide 20 acts as a waveguide coupler from a rectangular to a circular symmetric microwave mode for more uniform plasmas. This embodiment also reduces the loss of hot electrons to the launcher walls and results in higher efficiency of main plasma 4 production.

In another embodiment of the invention, the plasma density, uniformity, and power efficiency can be improved substantially by controlling the relative contributions of the launcher ECR plasma 26 and line cusp ECR plasma 27. This is accomplished with an additional microwave feed 33 that can introduce microwaves directly into the region of the line cusp ECR plasma 27. The microwave feed 33 is independent of the microwave generator 25 and may by of the waveguide, coaxial, or rod antenna types, for example. One or more of the microwave feeds 33 may be spaced around the plasma chamber for introducing microwaves into the line cusp ECR plasma region. This embodiment of the invention would provide excellent control of the relative amounts of launcher ECR plasma 26 and line cusp plasma 27—even during operation in the overdense mode. It would provide capability for optimizing the plasma uniformity over an even wider range of operating conditions.

In another embodiment of the invention, a hybrid waveguide polarizer (not shown) can replace the rectangular waveguide 24. This component can be a commercial product, for example, a Model No. PH3400M1, WR 340 waveguide size, manufacured by the Atlantic Microwave Company. For this embodiment of the invention, the microwave generator 25 should provide two off-phase microwave outputs, one each to both input rectangular ports of the hybrid waveguide polarizer. The microwave output power from the hybrid waveguide polarizer has a certain ratio of LHCP/RHCP. The phase angle of the two microwave outputs from the generator 25 controls the ratio of LHCP/RHCP in the microwave power launched into the microwave waveguide launcher 2. Consequently, the range of operating parameters of the plasma generating apparatus 1 for producing uniform plasmas in optimized modes can be substantially increased.

The special features of various components of the plasma generating apparatus of this invention are further elaborated below.

Plasma generating apparatus 1: (1) It can produce a uniform and dense plasma over a large area over the substrate to be plasma processed. (2) Special feature (1) results from the rapid decrease of the solenoid field and the magnetic multicusp confinement and generation of plasma particles and hot electrons. (3) The excellent confinement of hot electrons and plasmas in this multipole design leads to an efficiently generated main plasma 4. (4) Special feature (2) allows movement of the substrate closer to the main plasma region 4 where free radicals, essential for many processes, are produced, all the while maintaining a low magnetic field and good uniformity at the substrate.

Microwave waveguide launcher 2: (1) The launcher waveguide 20 can be constructed with the same rectangular cross-section as a standard S-band waveguide. (2) The output end 30 of the launcher waveguide 20 can be tapered to a circular cone. The hot electrons produced in the launcher ECR plasma 26 can drift or diffuse along the magnetic field lines 29 to the line cusp ECR plasma 27 and produce plasma there or in the main plasma 4 more efficiently than the standard S-band rectangular cross-section launcher waveguide. (3) The soft iron magnetic flux return 22 can be designed to reduce the required exciting coil current and reduce the stray field in the near-magnetic field-free region 5. (4) Special feature (3) allows replacement of the solenoid magnet 21 with a smaller magnet. (5) Special feature (2) can enhance the power efficiency in plasma production.

Cylindrical multipole magnetic field 3: (1) The multipole magnetic field can effectively contain hot electrons and cold plasmas produced by the ECR plasmas 26 and 27, and the cold plasma produced in the main plasma 4. (2) The good magnetic confinement of the plasma in the main plasma chamber 31 enhances the transport of this plasma to the near-magnetic field-free region 5 to be used for performing plasma processing on the substrate.

(3) The above two features make this plasma generating apparatus an efficient device for plasma processing.

Vacuum liner 12: (1) The material of the thin vacuum liner should be selected based on the particular application at hand. The material chosen should be relatively inert to the processing gas and plasmas, so as not to create impurities in the main plasma chamber. Stainless steel, quartz, and anodized aluminum are some liner materials.

Metal substrate holder 7: (1) The substrate holder should be electrically insulated from the base or bottom plate 15. This arrangement provides the flexibility of applying an electrical biasing to the substrate. (2) The substrate holder can be designed and built with cooling and heating capability necessary for plasma processing. (3) With the control of the electrical biasing supply 11 and the substrate temperature, the plasma processing can be optimized for particular plasma conditions.

Microwave screen 14: (1) The microwave screen should be designed and built to provide sufficient gas pumping and also to minimize microwave leakage. (2) In overdense operating modes, the microwave power is efficiently absorbed or reflected by the ECR plasmas 26 and 27 causing the microwave power at the microwave screen to be negligible. In this mode, the microwave screen may be not needed. (3) When operating in underdense modes, a significant fraction of the microwave power may reach the bottom plate 15. In this case, the microwave screen 14 can improve the plasma production efficiency.

The plasma generating apparatus 1 described herein has various uses. It may be used to etch a substrate 6 to produce a pattern thereon, or can be used to deposit a component from the feed gas system 32 onto a substrate 6. Certain other modifications are considered to be within the skill of the art. These would include, for example, replacing the substrate holder 7 with a general mounting fixture for processing any sample or, for ion source applications, replacing the substrate holder 7 with grids for direct extraction of plasma.

From the foregoing, it will be understood that a microwave plasma generating apparatus with two ECR plasmas and particular magnetic field configuration has been developed. Of principal interest is the generation of a dense, uniform and large area plasma that can be used for several microwave plasma processing applications such as semiconductor etching and deposition processing of thin films.

Only certain embodiments of the present invention have been described in detail. This is not to limit the invention, however, and the invention is to be limited only by the appended claims attached hereto, or their equivalents, when read together with the detailed description of the invention.

We claim:

1. A plasma generating apparatus comprising:
   a vacuum vessel;
   a processing gas introduced into said vacuum vessel;
   a microwave generator;
   a launcher waveguide connected for receiving microwaves from said microwave generator and conveying said microwaves into said vacuum vessel;
   a solenoid coil disposed about said launcher waveguide and producing a high flux magnetic field, said high flux magnetic field interacting with said microwaves and said processing gas to produce a dense ECR plasma, said dense ECR plasma diffusing into said vacuum vessel; and
   a soft iron magnetic flux return positioned around said solenoid coil, said magnetic flux return interacting with said high flux magnetic field to reduce the exciting current in said solenoid coil required for said dense ECR plasma condition and minimize stray magnetic field in said vacuum vessel.

2. A plasma generating apparatus according to claim 1, further comprising a hybrid waveguide polarizer disposed between said microwave generator and said launcher waveguide for passing right hand circularly polarized microwaves and left hand circularly polarized microwaves to said launcher waveguide.

3. A plasma generating apparatus according to claim 1, wherein said launcher waveguide has a rectangular output end.

4. A plasma generating apparatus according to claim 1, wherein said launcher waveguide has a conical output end.

5. A plasma generating apparatus according to claim 1, wherein said processing gas further includes a component for deposition onto a substrate.

6. A plasma etch apparatus for large area plasma etching of a sample comprising:
   a vacuum vessel comprising a bottom plate, cylindrical wall, and top plate:
   a sample holder disposed in said vacuum vessel;
   a processing gas introduced into said vacuum vessel;
   a microwave waveguide launcher attached to said top plate and coaxial with said cylindrical wall;
   a microwave generator;
   a waveguide disposed in said microwave waveguide launcher for receiving microwaves from said microwave generator;
   a launcher waveguide disposed in the vacuum vessel end of said microwave waveguide launcher;
   a microwave window disposed in said microwave waveguide launcher between said waveguide and said launcher waveguide;
   a solenoid coil disposed around said microwave waveguide launcher, said solenoid coil providing a coaxial induced high flux magnetic field within said microwave waveguide launcher, and said processing gas, microwaves, and magnetic field producing a dense ECR plasma in the vacuum vessel end of said launcher waveguide in said microwave waveguide launcher, and said dense ECR plasma diffusing into said vacuum vessel to produce a main plasma therein;
   a plurality of line cusp permanent magnet columns equally spaced about said cylindrical wall, said line cusp permanent magnets producing a line cusp magnetic field at said cylindrical wall, and said processing gas, microwaves and line cusp magnetic field producing a line cusp ECR plasma at said permanent magnet columns, and said line cusp ECR plasma diffusing into said vacuum vessel and contributing to the formation of said main plasma; and
   a cylindrically-shaped soft iron magnetic flux return disposed around said solenoid coil, said flux return interacting with said high flux magnetic field to reduce the exciting current in said solenoid coil required for said dense ECR plasma condition and minimize stray magnetic field in said vacuum vessel.

7. A plasma etch apparatus according to claim 6, further comprising upper ring magnets mounted in grooves in said top plate and lower ring magnets mounted in grooves in said bottom plate, the innermost of said upper ring magnets having polarity opposite to that of said solenoid coil, and the innermost of said lower ring magnets having polarity identical to that of said innermost upper ring magnet.

8. A plasma etch apparatus according to claim 6, further comprising a hybrid waveguide polarizer disposed between said microwave generator and said microwave waveguide launcher and capable of providing controllable amounts of right hand circularly polarized microwaves and left hand circularly polarized microwaves from said microwave generator to said microwave waveguide launcher.

9. A plasma etch apparatus according to claim 6, wherein said processing gas is oxygen.

10. A plasma generating apparatus comprising:
a vacuum vessel;
a processing gas introduced into said vacuum vessel;
a microwave generator;
a launcher waveguide connected for receiving microwaves from said microwave generator and conveying said microwaves into said vacuum vessel;
a solenoid coil disposed around said launcher waveguide and producing a high flux magnetic field, said high flux magnetic field interacting with said microwaves and said processing gas to produce a dense ECR plasma, said dense ECR plasma diffusing into said vacuum vessel to produce a uniform and dense main plasma therein;
a soft iron magnetic flux return positioned around said solenoid coil, said magnetic flux return interacting with said high flux magnetic field to reduce the exciting current in said solenoid coil required for said dense ECR plasma condition and minimize stray magnetic field in said vacuum vessel; and
a plurality of line cusp permanent magnet columns equally spaced about said vacuum vessel, said magnet columns producing a line cusp magnetic field for confining said main plasma.

11. A plasma generating apparatus comprising:
a vacuum vessel;
a processing gas introduced into said vacuum vessel;
a microwave generator;
a launcher waveguide connected for receiving microwaves from said microwave generator and conveying said microwaves into said vacuum vessel;
a solenoid coil disposed around said launcher waveguide and producing a high flux magnetic field, said high flux magnetic field interacting with said microwaves and said processing gas to produce a dense ECR plasma, said dense ECR plasma diffusing into said vacuum vessel to produce a uniform and dense main plasma therein;
a soft iron magnetic flux return positioned around said solenoid coil, said magnetic flux return interacting with said high flux magnetic field to reduce the exciting current in said solenoid coil required for said dense ECR plasma condition and minimize stray magnetic field in said vacuum vessel; and
a plurality of line cusp permanent magnet columns equally spaced about said vacuum vessel, said permanent magnets being of strong magnetic field to produce the ECR plasma formation condition at said line cusp columns, said processing gas, microwaves and line cusp magnetic field interacting to produce a line cusp ECR plasma at said permanent magnet columns, and said line cusp ECR plasma diffusing into said vacuum vessel and contributing to the formation of said main plasma.

12. A plasma generating apparatus according to claim 11, wherein said line cusp permanent magnet columns are comprised of samarium cobalt magnets.

13. A plasma generating apparatus according to claim 11, further comprising at least one additional microwave feed introducing microwaves into said line cusp ECR plasma region.

* * * * *